(12) United States Patent
Lee

(10) Patent No.: US 7,958,434 B1
(45) Date of Patent: Jun. 7, 2011

(54) METHOD FOR SYNCHRONIZING TO A DIGITAL SIGNAL

(75) Inventor: Chris Cheng-Chieh Lee, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 985 days.

(21) Appl. No.: 11/828,185

(22) Filed: Jul. 25, 2007

Related U.S. Application Data

(60) Provisional application No. 60/820,423, filed on Jul. 26, 2006.

(51) Int. Cl.
*H03M 13/00* (2006.01)
(52) U.S. Cl. .......................... 714/775; 714/776
(58) Field of Classification Search .................. 714/775, 714/776
See application file for complete search history.

(56) References Cited

U.S. PATENT DOCUMENTS

| | | | | |
|---|---|---|---|---|
| 5,241,546 A | * | 8/1993 | Peterson et al. | 714/761 |
| 5,563,896 A | * | 10/1996 | Nakaguchi | 714/785 |
| 6,025,881 A | * | 2/2000 | Kikuchi et al. | 375/240.18 |
| 2003/0012228 A1 | * | 1/2003 | Tanaka et al. | 370/529 |
| 2004/0260996 A1 | * | 12/2004 | Heppe | 714/755 |

* cited by examiner

*Primary Examiner* — M. Mujtaba K Chaudry

(57) ABSTRACT

In a method for synchronizing to a signal encoded as a group of blocks, a data symbol is received and stored with previously received data symbols as a current potential group. Errors, if any, are detected in the current potential group, and a level of errors associated with the current potential group is deter mined. The current potential group is determined to be an actual group if the current potential group is without errors. Also, the current potential group is determined to be an actual group if a set of potential groups including the current potential group and at least one previous potential group has an acceptable level of errors.

30 Claims, 13 Drawing Sheets

US 7,958,434 B1

METHOD FOR SYNCHRONIZING TO A DIGITAL SIGNAL

CROSS-REFERENCES TO RELATED APPLICATIONS

The present application claims the benefit of U.S. Provisional Application No. 60/820,423, entitled "GROUP CODE SYNCHRONIZATION USING BLOCK RECEPTION GRADE," filed on Jul. 26, 2006, which is hereby incorporated by reference herein in its entirety.

FIELD OF TECHNOLOGY

The present disclosure relates generally to communication systems, and more particularly, to synchronizing to a received digital signal.

DESCRIPTION OF THE RELATED ART

In some communication systems, group error correction coding (ECC) may be performed on a group of data blocks that are to be transmitted to a receiver. FIG. 1 is a block diagram illustrating an example group ECC process 100. In this example, k data units $c_1, c_2, \ldots c_k$ are encoded as a group. In particular, each data unit $c_1, c_2, \ldots c_k$ includes m bits and is multiplied by an n-by-m generator matrix G, where n is the number of redundant bits to be generated. Then, a respective n-bit offset (offset', $\text{offset}_2, \ldots \text{offset}_k$) is added to each multiplication result to generate k sets of redundant bits $d_1, d_2, \ldots d_k$, each set having n bits. The sets of redundant bits $d_1, d_2, \ldots d_k$ are then appended to the respective data units $c_1, c_2, \ldots c_k$, and each pair of $c_1, c_2, \ldots c_k$ and $d_1, d_2, \ldots d_k$ forms a block of m+n bits. Thus, the group of blocks includes (m+n)k bits. The next group of blocks may be encoded similarly.

A receiver may receive groups of blocks encoded as illustrated in FIG. 1. In order for the receiver to properly decode such groups, the receiver determines where a group begins. One method for determining where a group begins includes storing received bits in a shift register and repeatedly performing error detection on the contents of the shift register until no errors are detected. This may indicate that the contents of the shift register correspond to a group. Thus, the borders of the group are then known.

FIG. 2 is a block diagram of a group detection device 150 for a receiver. The group detection device 150 includes a shift register 154 that stores received bits. Portions of the shift register 154, each having m+n bits, are coupled to multipliers 158, 162, 166 that multiply the portions by an n-by-(m+n) parity check matrix H. If the portion of the shift register 154 that is coupled to the multiplier 158, for example, holds the original data unit $c_1$ and the corresponding redundant data bits $d_1$, the output of the multiplier 158 will be a known n-bit value $\text{syndrome}_1$. Summation devices 170, 174, 178 are coupled to the multipliers 158, 162, 166 to subtract respective syndrome values from the outputs of the multipliers 158, 162, 166. Thus, the outputs of the summation devices 170, 174, 178 will be zero when the shift register 154 holds values corresponding to the original group without any errors. A logic block 182 receives the outputs of the summation devices 170, 174, 178 and generates a GROUP DETECTED signal to indicate when all of the outputs of the summation devices 170, 174, 178 are zero.

Once the group detection device 150 detects a group, this information can be utilized by the receiver for receiving further groups. For instance, once a group is detected, the receiver can wait for (m+n)k further bits to be shifted into the shift register 154 before attempting to decode those bits.

The group detection device 150 detects a group only when the bits in the shift register 154 exactly correspond to the original group of data. In other words, if there are any errors, the group detection device 150 will fail to detect the group.

FIG. 3 is a block diagram of another group detection device 200 for a receiver. The group detection device includes a shift register 204, similar to the shift register 154 of FIG. 2. Portions of the shift register 204, each having m+n bits, are coupled to inputs of block correctors 208, 212, 216. Each block corrector 208, 212, 216 also includes an input to receive an n-bit offset corresponding to the n-bit offsets $\text{offset}_1$, $\text{offset}_2, \ldots \text{offset}_k$ of FIG. 1. Each block corrector 208, 212, 216 is capable of generating an output indicative of whether it can correct errors, if any, in the corresponding m+n bit portion of the shift register 204. These outputs are coupled to a logic block 220 that generates a GROUP DETECTED signal to indicate when all of the outputs of the block corrector 208, 212, 216 indicate that all of the k portions of the shift register 204 have data that are correctable. Thus, the GROUP DETECTED signal will indicate detection of a group when the shift register 204 holds values corresponding to the original group without any errors or with errors that are correctable by the block corrector 208, 212, 216.

Each block corrector 208, 212, 216 is also capable of correcting at least some errors in the value stored in the corresponding portion of the shift register 204. For example, if there are too many errors, the block corrector 208 may not be able to correct the errors. Each block corrector 208, 212, 216 may receive an m+n bit portion of the shift register 204, a corresponding offset value, and may generate a corrected m+n bit value. The corrected m+n bit values of the block correctors 208, 212, 216 are provided to a register 224. Thus, if errors in the bit values stored in the shift register 204 are correctable by the block correctors 208, 212, 216, the block correctors 208, 212, 216 will store the original group in the register 224.

Once the group detection device 200 detects a group, this information can be utilized by the receiver for receiving further groups. For instance, once a group is detected, the receiver can wait for (m+n)k further bits to be shifted into the shift register 204 before attempting to decode those bits.

With the technique described with respect to FIG. 2, initially obtaining synchronization is difficult when there are errors with the received symbols. The technique described respect to FIG. 3 may partially alleviate this drawback of FIG. 2, but the technique of FIG. 3 may result in false groups being detected. The techniques of FIGS. 2 and 3 can be combined. For example, the group detection device 150 of FIG. 2 can be used to detect groups when the receiver is unsynchronized, and the group detection device 200 of FIG. 3 can used once the receiver is synchronized. FIG. 4 is a flow diagram of a method 250 that is implemented by a receiver using both of the techniques of FIG. 2 and FIG. 3, and will be described with reference to FIGS. 2 and 3. At a block 254, a state variable Sync is initialized to a value FALSE to indicate that the receiver is initially not synchronized to group boundaries. At a block 256, a new bit is received, and at a block 258 the new bit is shifted into the shift register.

At a block 260, the Sync variable is examined to determine whether the receiver is synchronized to group boundaries. If the Sync variable has a value FALSE, the flow proceeds to a block 262. At the block 262, error detection is performed by the logic block 182. In particular, the logic block 182 determines whether the value in the shift register corresponds exactly to the transmitted group, i.e., it determines whether there are any errors, by determining whether the outputs of the summation devices 170, 174, 178 are all zero. At a block 264, the logic block 220 generates the GROUP DETECTED signal to indicate whether or not the value stored in the shift register is an error-free group. If not, the flow returns to the block 256 to receive the next bit.

If at the block 264 the logic block 182 determines that the value stored in the shift register is a group, the flow proceeds to a block 268. At the block 268, the value stored in shift register is decoded. At a block 270, the Sync variable is set to a value TRUE to indicate that the receiver is now synchronized to group boundaries. At a block 272, a variable Counter is set to the value (m+n)k to indicate that (m+n)k more bits must be shifted into the shift register before the next group is fully received.

Referring again to the block 260, if the Sync variable has the value TRUE, this indicates that the receiver is synchronized to group boundaries and the flow proceeds to a block 274. At the block 274, the Counter variable is decremented to reflect that another bit was shifted into the shift register 204. At a block 278, it is determined whether the value of Counter is greater than zero. If it is, this indicates that the next group has not yet been fully received. If the value of Counter equals zero, this indicates that the next group is now received, and the flow proceeds to a block 282. At the block 282, the block correctors 208, 212, 216 attempt to correct errors, if any, in the received data. Then, at a block 284, it is determined if any errors are uncorrectable. If there are uncorrectable errors, it is assumed that the receiver is no longer synchronized. Thus, at a block 286, the Sync variable is set to FALSE and the flow proceeds back to the block 256 to receive the next bit. If at the block 284 it is determined that there were no uncorrectable errors, the flow may proceed to the block 268, at which the value stored in the shift register (or the register 224) is decoded.

FIG. 5 is a diagram illustrating a series of groups 302, 304, 306, 308, 310, received by a receiver, and will be used to illustrate the method 250 of FIG. 4. Each group includes four data blocks (i.e., k=4). A block having no cross-hatching indicates the block was received without errors. A block having diagonal cross-hatching indicates the block was received with uncorrectable errors. A block with horizontal cross-hatching indicates that block was received with correctable errors. Group boundaries are indicated by dashed vertical lines.

The group previous to the group 302 included a block with uncorrectable errors. Thus, the receiver is unsynchronized when it begins receiving the group 302. Because the group 302 includes errors and because the receiver is unsynchronized, the receiver will not detect the group 302. For the same reason, the receiver will not detect the group 304. The group 306, however, is error free. Thus, the receiver will detect the group 306, and thus it will become synchronized to group boundaries. The group 308 includes a group having errors. But because the errors are correctable and because the receiver is synchronized, the receiver will detect the group 308. The group 310 includes a block having uncorrectable errors. Thus, the receiver will not detect the group 310 and will become unsynchronized.

FIG. 6 is a diagram illustrating a series of groups 312, 314, 316, 318, 320, received by a receiver. The group previous to the group 312 included a block with uncorrectable errors. Thus, the receiver is unsynchronized when it begins receiving the group 312. Because the group 312 includes errors and because the receiver is unsynchronized, the receiver will not detect the group 312. For the same reason, the receiver will not detect any of the groups 314, 316, 318, 320. Thus, the receiver will not detect any of the groups 312, 314, 316, 318, 320 and will remain unsynchronized.

SUMMARY OF THE DISCLOSURE

In one embodiment, a method for synchronizing to a signal encoded as a group of blocks comprises receiving a data symbol, and storing the received data symbol with previously received data symbols as a current potential group. The method also comprises detecting errors, if any, in the current potential group, and determining a level of errors associated with the current potential group. Additionally, the method comprises determining the current potential group is an actual group if the current potential group is without errors. The method further comprises determining the current potential group is an actual group if a set of L potential groups including the current potential group and at least one previous potential group has an acceptable level of errors. The set of L potential groups is from a set of P consecutive potential groups, wherein P is an integer greater than one and L is an integer less than or equal to P.

In another embodiment, a method of decoding data that is encoded as a group of blocks includes, if a group boundary is not known, receiving a data symbol, and storing the received data symbol with previously received data symbols as a current potential group. Additionally, the method includes, if the group boundary is not known, detecting errors, if any, in the current potential group, and determining a level of errors associated with the current potential group. Further, the method includes, if the group boundary is not known, determining the current potential group is an actual group if the current potential group is without errors, and determining the current potential group is an actual group if a set of L potential groups including the current potential group and at least one previous potential group has an acceptable level of errors. Still further, the method includes, if the group boundary is not known, correcting errors, if any, in the actual group if it is determined that the current potential group is the actual group, and decoding the actual group if it is determined that the current potential group is the actual group. Moreover, the method includes, if the group boundary is known, receiving a plurality of data symbols corresponding to a next group, and storing the plurality of received data symbols as the next group. The method also includes, if the group boundary is known, detecting errors, if any, in the next group, and indicating that group boundaries are unknown if an uncorrectable error is detected. Additionally, the method includes, if the group boundary is known, correcting errors in the next group if no uncorrectable errors are detected, and decoding the next group if no uncorrectable errors are detected.

In yet another embodiment, a group detection device to detect data encoded as a group of blocks, comprises a shift register. An error detector is coupled to the shift register. The error detector is configured to detect errors in each block of a plurality of blocks of a current potential group stored in the shift register, and the error detector includes an output to indicate whether each block is error free. A block corrector is coupled to the shift register. The block corrector configured to correct errors, when possible, in each block of a plurality of blocks of the current potential group stored in the shift register, and the block corrector includes an output to indicate whether each block includes uncorrectable errors. The group detection device also comprises a memory, and a logic block coupled to the output of the error detector and the output of the block corrector, and coupled to the memory. The logic block is configured to determine a level of errors associated with the current potential group based on at least one of the output of the error detector and the output of the block corrector, and is configured to store the determined level of errors in the memory. Also, the logic block is configured to generate an indicator that the current potential group is an actual group if the current potential group is without errors, and is configured to generate an indicator that the current potential group is an actual group if a set of L potential groups including the current potential group and at least one previous potential group has an acceptable level of errors.

DETAILED DESCRIPTION

Figure 2:
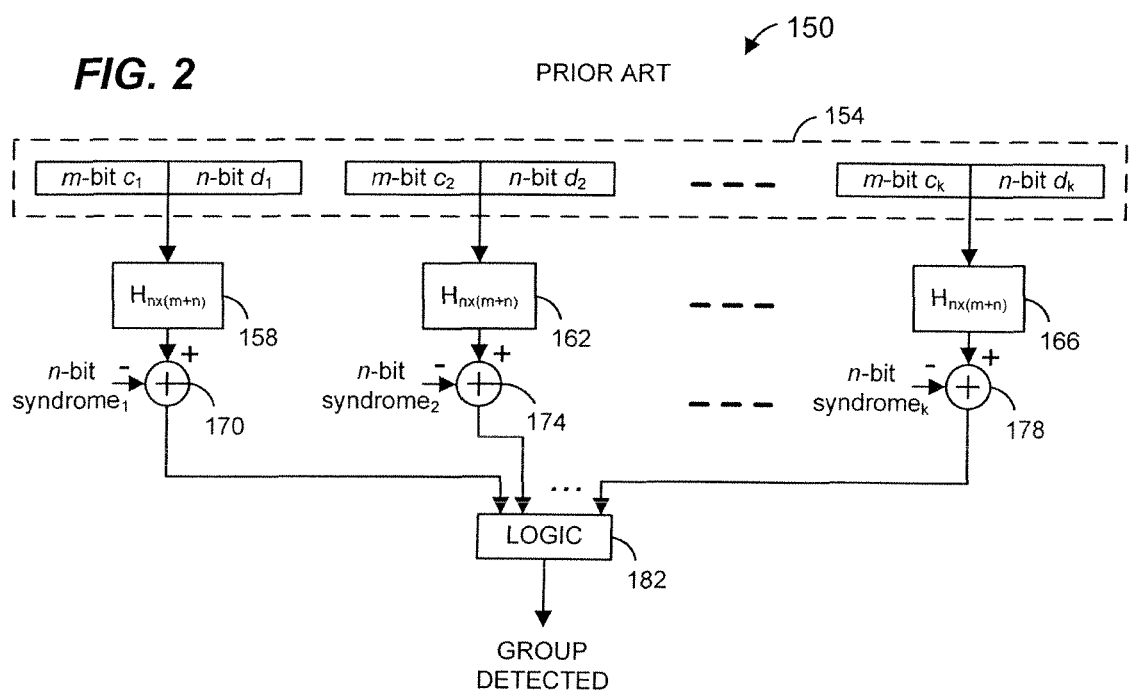
FIG. 2 is a group detection device for a receiver that is to receive groups encoded as illustrated in FIG. 1.
Figure 3:
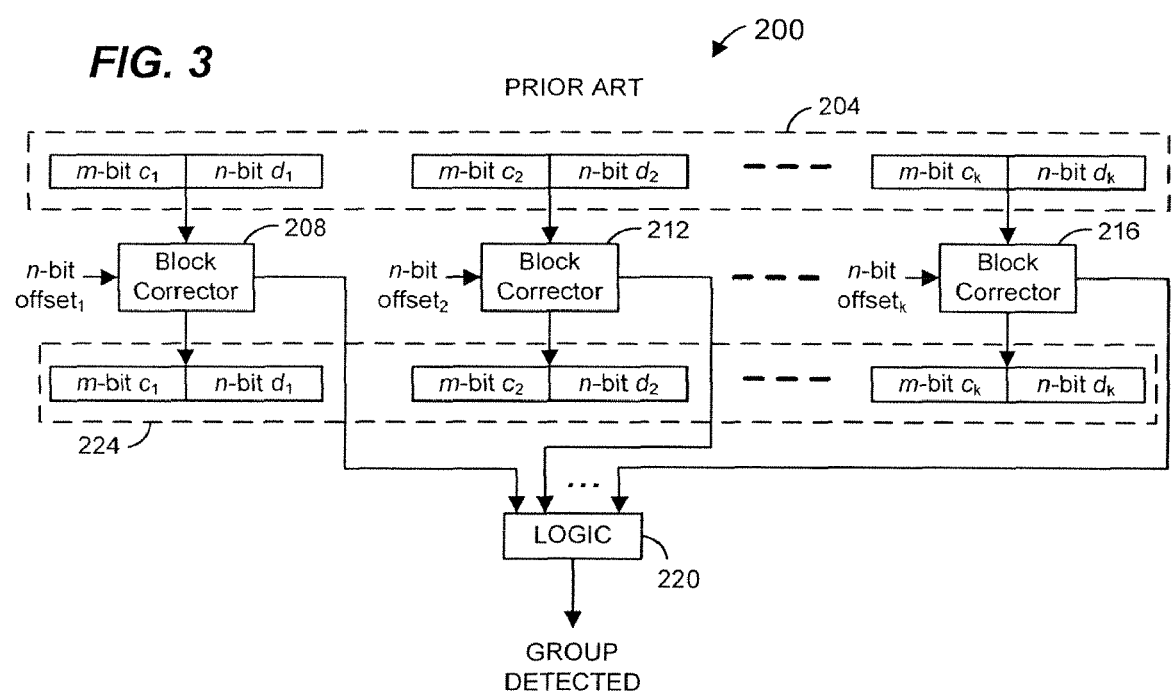
FIG. 3 is a block diagram of another group detection device for a receiver that is to receive groups encoded as illustrated in FIG. 1.
Figure 4:
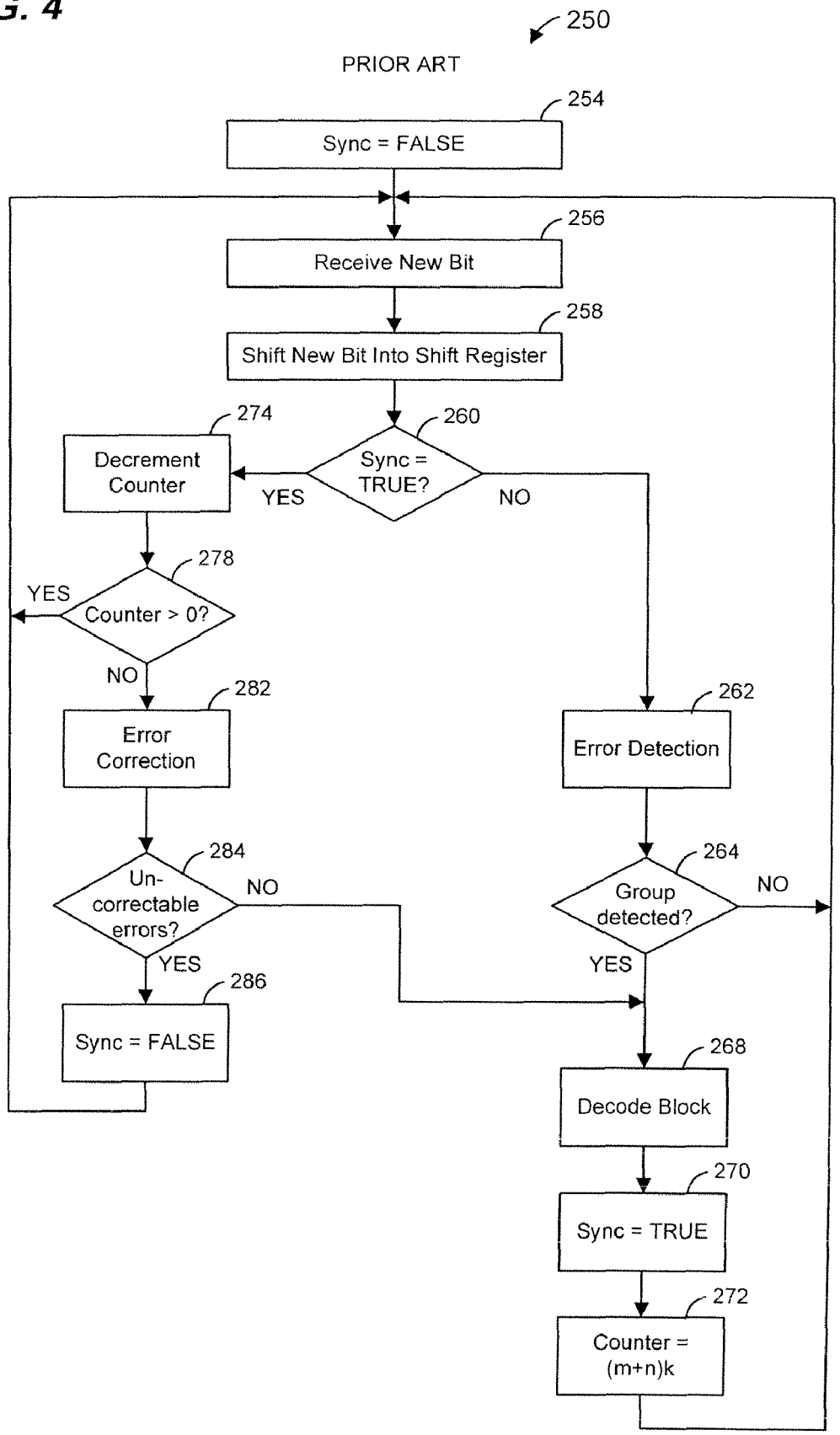
FIG. 4 is a flow diagram of a method that is implemented by a receiver using both of the techniques of FIG. 2 and FIG. 3.
Figure 5:
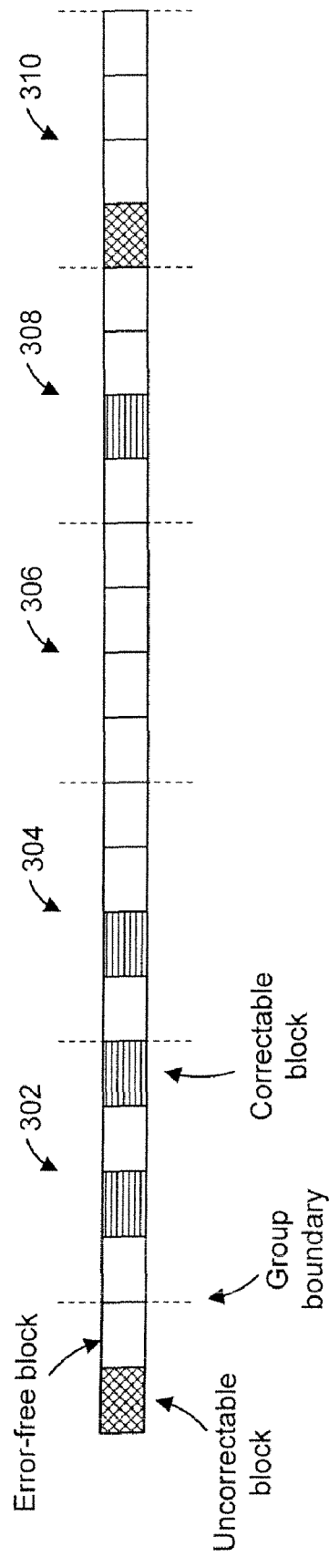
FIG. 5 is a diagram illustrating a series of data groups received by a receiver, each group including four data blocks.
Figure 6:
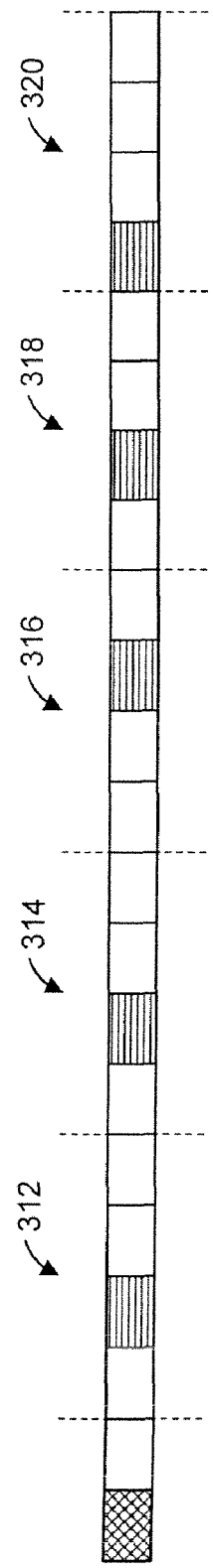
FIG. 6 is a diagram illustrating another series of data groups received by a receiver.
Figure 7:
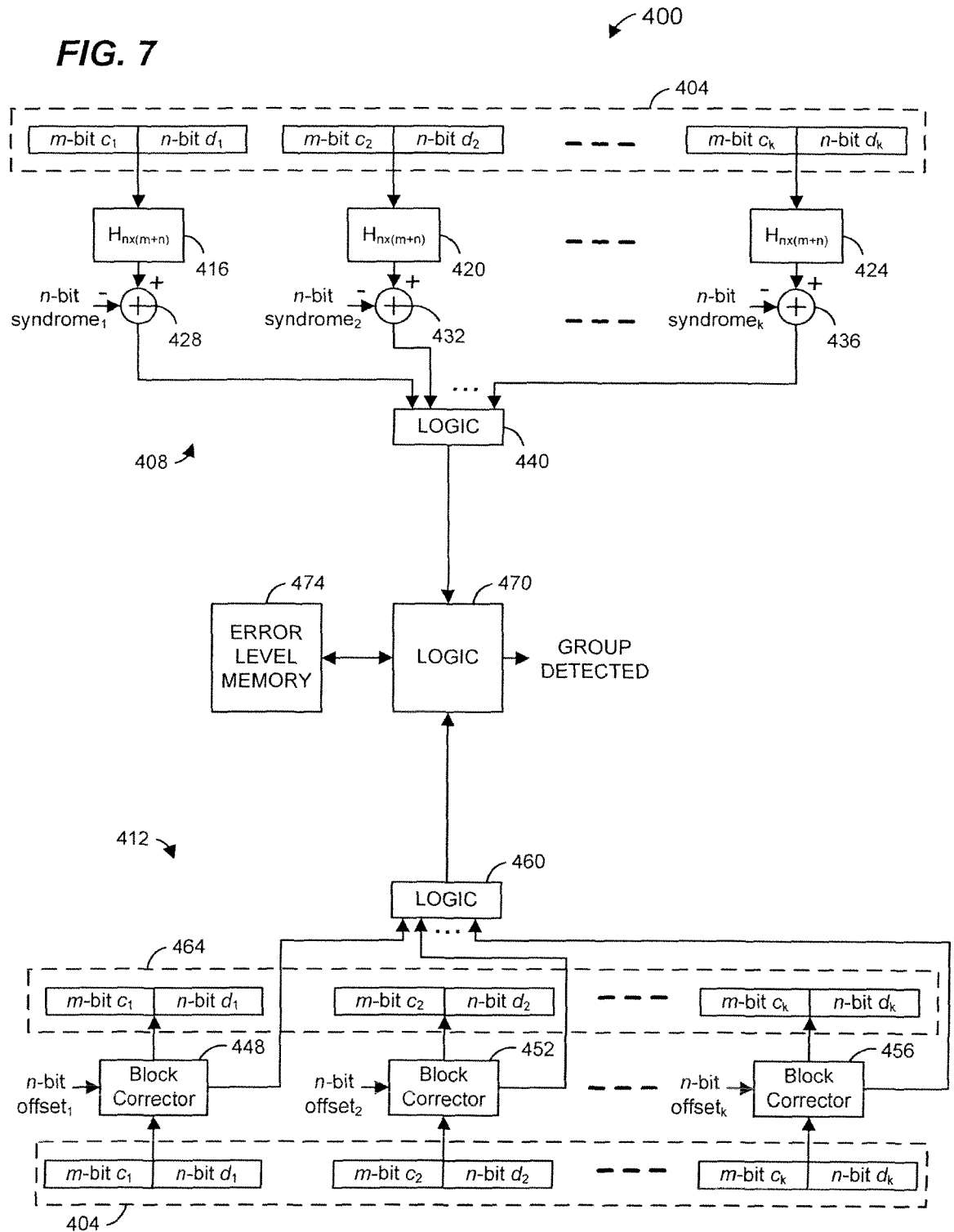
FIG. 7 is a block diagram of an example group detection system for synchronizing a receiver to received groups of block encoded data.

FIG. 7 is a block diagram of an example group detection system 400 for synchronizing a receiver to received groups of block encoded data. The system 400 includes a shift register 404 that stores received bits. The system also includes an error detection portion 408 and an error correction portion 412, each coupled to the shift register 404. The error detection portion 408 is similar to the group detection device 150 of FIG. 2. The error detection portion 408 includes multipliers 416, 420, 424. Portions of the shift register 404, each having m+n bits, are coupled to inputs of the multipliers 416, 420, 424. The multipliers 416, 420, 424 multiply the portions by an n-by-(m+n) parity check matrix H. If the portion of the shift register 404 that is coupled to the multiplier 416, for example, holds the original data unit $c_1$ and the corresponding redundant data bits $d_1$, the output of the multiplier 416 will be a known n-bit value syndrome$_1$. Summation devices 428, 432, 436 are coupled to the multipliers 416, 420, 424 to subtract respective syndrome values from the outputs of the multipliers 416, 420, 424. Thus, the outputs of the summation devices 428, 432, 436 will be zero when the shift register 404 holds values corresponding to the original group without any errors. A logic block 440 receives the outputs of the summation devices 428, 432, 436 and generates a signal to indicate when all of the outputs of the summation devices 428, 432, 436 are zero. In other words, the logic block 440 generates a signal that indicates when the shift register 404 holds values corresponding to the original group without any errors.

Figure 1:
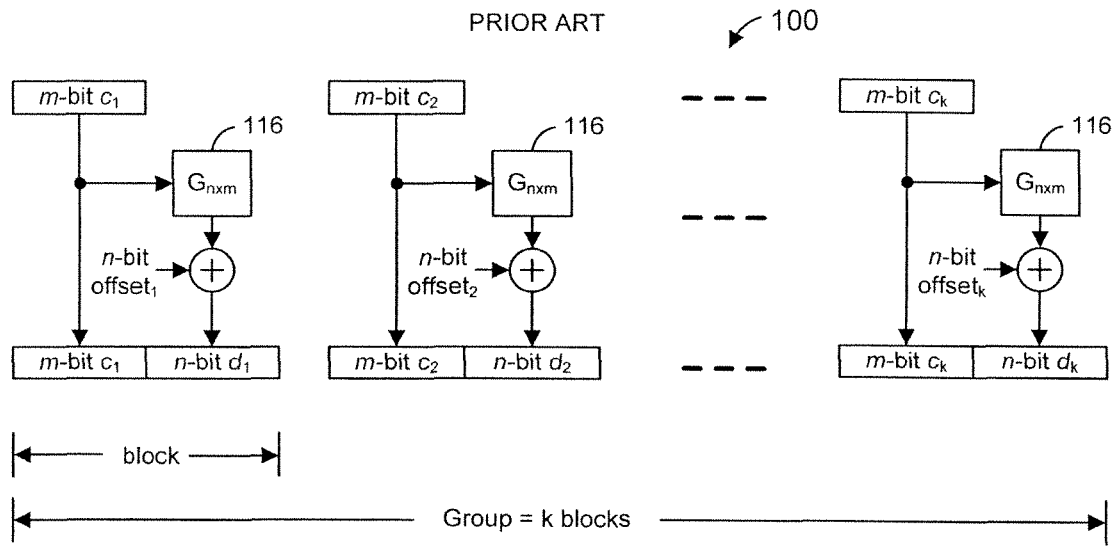
FIG. 1 is a block diagram illustrating an example group error correction coding process.

The error correction portion 412 includes block correctors 448, 452, 456 having inputs coupled to respective portions of the shift register 404, each portion having m+n bits. Additionally, the block correctors 448, 452, 456 include respective inputs to receive the n-bit offsets corresponding to the n-bit offsets offset$_1$, offset$_2$, . . . offset$_k$ of FIG. 1. Each block corrector 448, 452, 456 is capable of generating an output indicative of whether it can correct errors, if any, in the corresponding m+n bit portion of the shift register 404. These outputs are coupled to a logic block 460. The logic block 460 generates an indicator of the level of errors in the group value stored in the shift register 404 based on the outputs received from the block correctors 448, 452, 456. The indicator may be generated based on other information as well. Examples of indicators that may be generated by the logic block 460 will be described below. As just one example, the logic block 460 may generate an indicator of whether there are any uncorrectable errors in the group value stored in the shift register 404.

Each block corrector 448, 452, 456 is also capable of correcting at least some errors in the value stored in the corresponding portion of the shift register 404. For example, if there are too many errors in $c_1$ and/or $d_1$, the block corrector 448 may not be able to correct the errors. Each block corrector 448, 452, 456 may receive an m+n bit portion of the shift register 404, a corresponding offset value, and may generate a corrected m+n bit value. The corrected m+n bit values of the block correctors 448, 452, 456 are provided to a register 464. Thus, if errors in the bit values stored in the shift register 404 are correctable by the block correctors 448, 452, 456, the block correctors 448, 452, 456 will store the original group in the register 464. The register 464 may be the shift register 404 or a separate register.

The outputs of the logic blocks 440 and 460 are coupled to inputs of another logic block 470. The logic block 470 will generate a GROUP DETECTED signal that indicates whether or not a group is in the shift register 404. Generation of the GROUP DETECTED signal is based on at least one of the outputs of the logic blocks 440 and 460. Example operations of the logic block 470 will be described in more detail below. As just one example, the logic block 470 may indicate a group is detected when the output of the logic block 440 indicates that the group value stored in the shift register 404 is error free. The logic block 470 may determine an error level associated with data stored in the shift register 404 (i.e., a potential group). The error level may indicate, for example, whether the potential group is error-free, whether the potential group has any uncorrectable errors, and/or some measure of the errors, if any, in the potential group. The error level information may be stored in the memory 474 for later use by the logic block 470.

Figure 8:
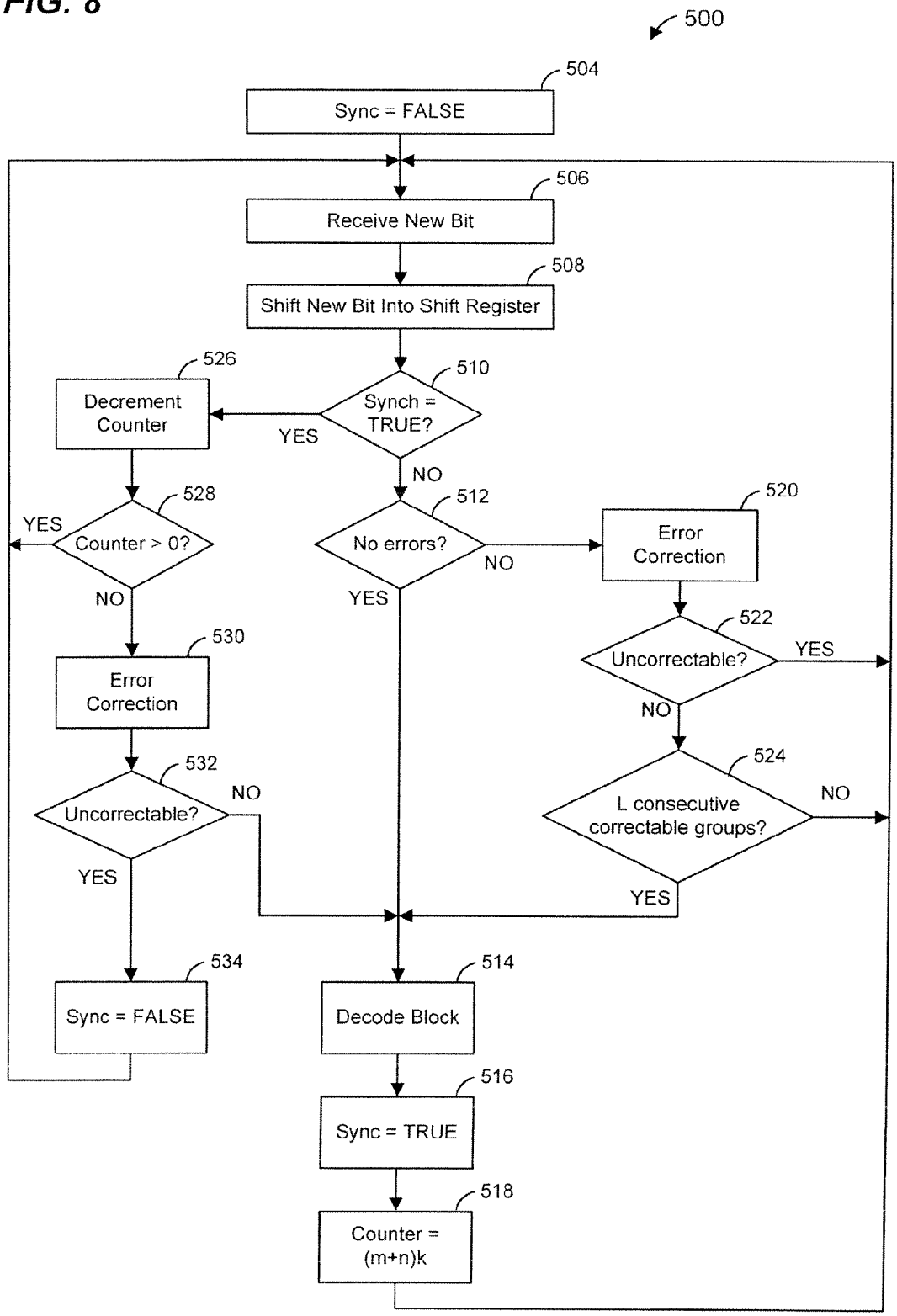
FIG. 8 is a flow diagram of an example method that may be implemented by a receiver having a group detection system such as the group detection system of FIG. 7.

FIG. 8 is a flow diagram of an example method 500 that may be implemented by a receiver having the group detection system such as the group detection system 400 of FIG. 7. Of course, the method 500 may be implemented by receivers having other types of group detection systems as well. For ease of explanation, the method 500 will be described with reference to FIG. 7. At a block 504, a state variable Sync is initialized to a value FALSE to indicate that the receiver is initially not synchronized to group boundaries. At a block 506, a new bit is received, and at a block 508 the new bit is shifted into the shift register 404.

At a block 510, the Sync variable is examined to determine whether the receiver is synchronized to group boundaries. If the Sync variable has a value FALSE, the flow proceeds to a block 512. At the block 512, it is determined whether the group value stored in the shift register 404 is error free. For example, the logic block 470 could examine the output of the logic block 440 to determine whether the group value stored in the shift register 404 is error free. If there are no errors, the flow may proceed to a block 514.

At the block 514, the value stored in shift register is decoded. At a block 516, the Sync variable is set to a value TRUE to indicate that the receiver is now synchronized to group boundaries. At a block 518, a Counter variable is set to the value (m+n)k to indicate that (m+n)k more bits must be shifted into the shift register 404 before the next group is fully received.

Referring again to the block 512, if it is determined that there are errors in the group value stored in the shift register, the flow may proceed to a block 520. At the block 520, error correction may be attempted. At a block 522, it may be determined if there are any uncorrectable errors. For example, the block correctors 448, 452, 456 could generate outputs that indicate whether they are unable to correct any errors in the group value stored in the shift register 404. These outputs are provided to the logic block 460, which in turn could generate an output indicating whether there are any uncorrectable errors in the group value stored in the shift register 404. The logic block 470 could examine the output of the logic block 460 to determine whether the group value stored in the shift register 404 includes any uncorrectable errors.

If there are any uncorrectable errors, the flow may return to the block 506 to receive the next bit. On the other hand, if there are no uncorrectable errors, the flow may proceed to the block 524. At the block 524, it may be determined whether there has been some number L of consecutive groups having correctable errors, where L is greater than one. For example, each time the block 522 is performed, the determination of whether there were any uncorrectable errors may be stored for future reference in the memory 474. Then, these results may be examined at the block 524 to determine whether (m+n)k bits ago, the group value was correctable. Similarly, the results may be examined to determine whether 2(m+n)k bits ago, the group value was correctable. This may be repeated, if necessary, for group values stored in the shift register 404 up to and including (L−1)(m+n)k bits ago. In other words it may be determined whether for each group value stored i(m+n)k bits ago, for i=1 to L−1, there were any uncorrectable errors. If all of these L−1 previous group values were correctable, the flow may proceed to the block 514. If any of the L−1 previous group values was uncorrectable, the flow may proceed back to the block 506 to receive the next bit. The block 524 may be implemented by the logic block 470, for example.

Referring again to the block 510, if the Sync variable has the value TRUE, this indicates that the receiver is synchronized to group boundaries and the flow proceeds to a block 526. At the block 526, the Counter variable is decremented to reflect that another bit was shifted into the shift register 404. At a block 528, it is determined whether the value of Counter is greater than zero. If it is, this indicates that the next group has not yet been fully received. If the value of Counter equals zero, this indicates that the next group is now received, and the flow proceeds to a block 530. At the block 530, the block correctors 448, 452, 456 attempt to correct errors, if any, in the received data. Then, at a block 532, it is determined if any errors are uncorrectable. If there are uncorrectable errors, it is assumed that the receiver is no longer synchronized. Thus, at a block 534, the Sync variable is set to FALSE and the flow proceeds back to the block 506 to receive the next bit. If at the block 532 it is determined that there were no uncorrectable errors, the flow may proceed to the block 514, at which the value stored in the shift register 404 (or the register 464) is decoded. The block 532 could be implemented by the logic block 470, for example. The logic block 470 could generate the GROUP DETECTED signal to indicate that a group was detected if it is determined at the block 532 that there are no uncorrectable errors. The logic block 470 could examine the output of the logic block 460 to determine if there were any uncorrectable errors, for example.

Figure 9:
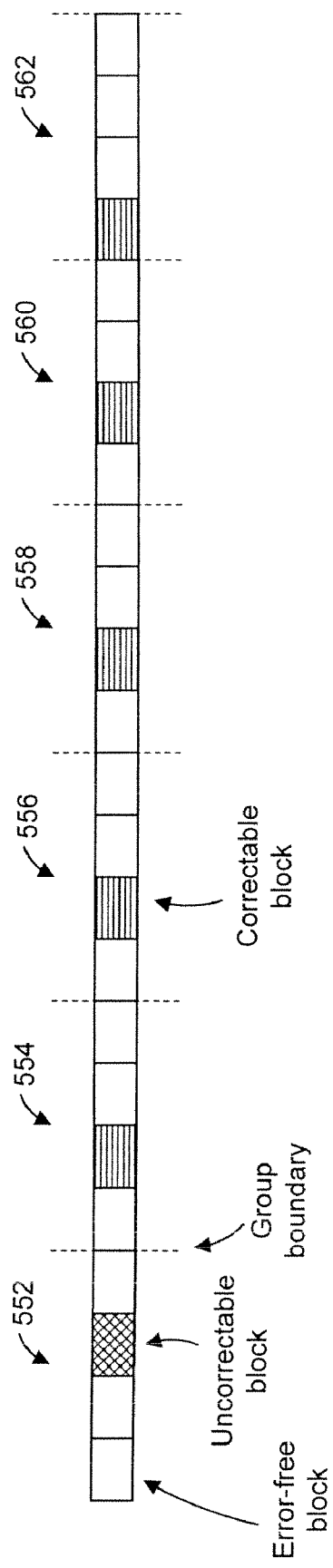
FIG. 9 is a diagram illustrating a series of data groups received by a receiver, each group including four data blocks.

FIG. 9 is a diagram illustrating a series of groups 552, 554, 556, 558, 560, 562, received by a receiver that implements the method 500 of FIG. 8, and will be used to illustrate the method 500. Each group includes four data blocks (i.e., k=4), and it is assumed that L=2. Of course, other values of k and L can be used, and these values will vary depending upon the particular implementation.

The group 552 includes a block with uncorrectable errors. Thus, the receiver is unsynchronized at least after it receives the group 552. Because the receiver is unsynchronized upon receiving the group 554, because the group 554 includes errors, and because the receiver has not received two consecutive groups (L=2) having correctable errors (the previous group (group 552) included uncorrectable errors), the receiver will not detect the group 554. The group 556 includes correctable errors. After the receiver receives the group 556, it has now received two consecutive groups having correctable errors. Because L=2, the receiver will become synchronized. Because none of the next groups 558, 560, and 562 includes uncorrectable errors, the receiver will remain synchronized.

Figure 10:
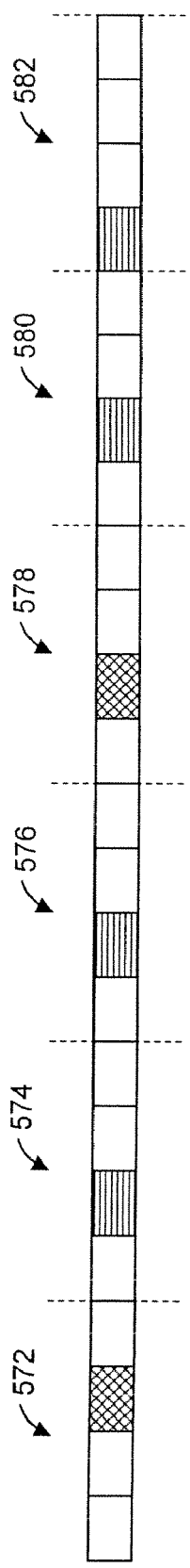
FIG. 10 is a diagram illustrating another series of data groups received by a receiver.

FIG. 10 is another diagram illustrating a series of groups 572, 574, 576, 578, 580, and 582, received by a receiver that implements the method 500 of FIG. 8, and also will be used to illustrate the method 500. The group 572 includes uncorrectable errors. Thus, the receiver is unsynchronized at least after it receives the group 572. Because the receiver is unsynchronized upon receiving the group 574, because the group 574 includes errors, and because the receiver has not received two consecutive groups (L=2) having correctable errors (the previous group (group 572) included uncorrectable errors), the receiver will not detect the group 574. The group 576 includes correctable errors. After the receiver receives the group 576, it has now received two consecutive groups having correctable errors. Because L=2, the receiver will become synchronized.

The group 578 includes uncorrectable errors. Thus, the receiver will become unsynchronized after receiving the group 578. Because the receiver is unsynchronized, the group 580 includes errors, and the previous group included uncorrectable errors, the receiver will not detect the group 580. The group 582 includes correctable errors. After the receiver receives the group 582, it has now received two consecutive groups having correctable errors. Because L=2, the receiver will become synchronized.

Figure 11:
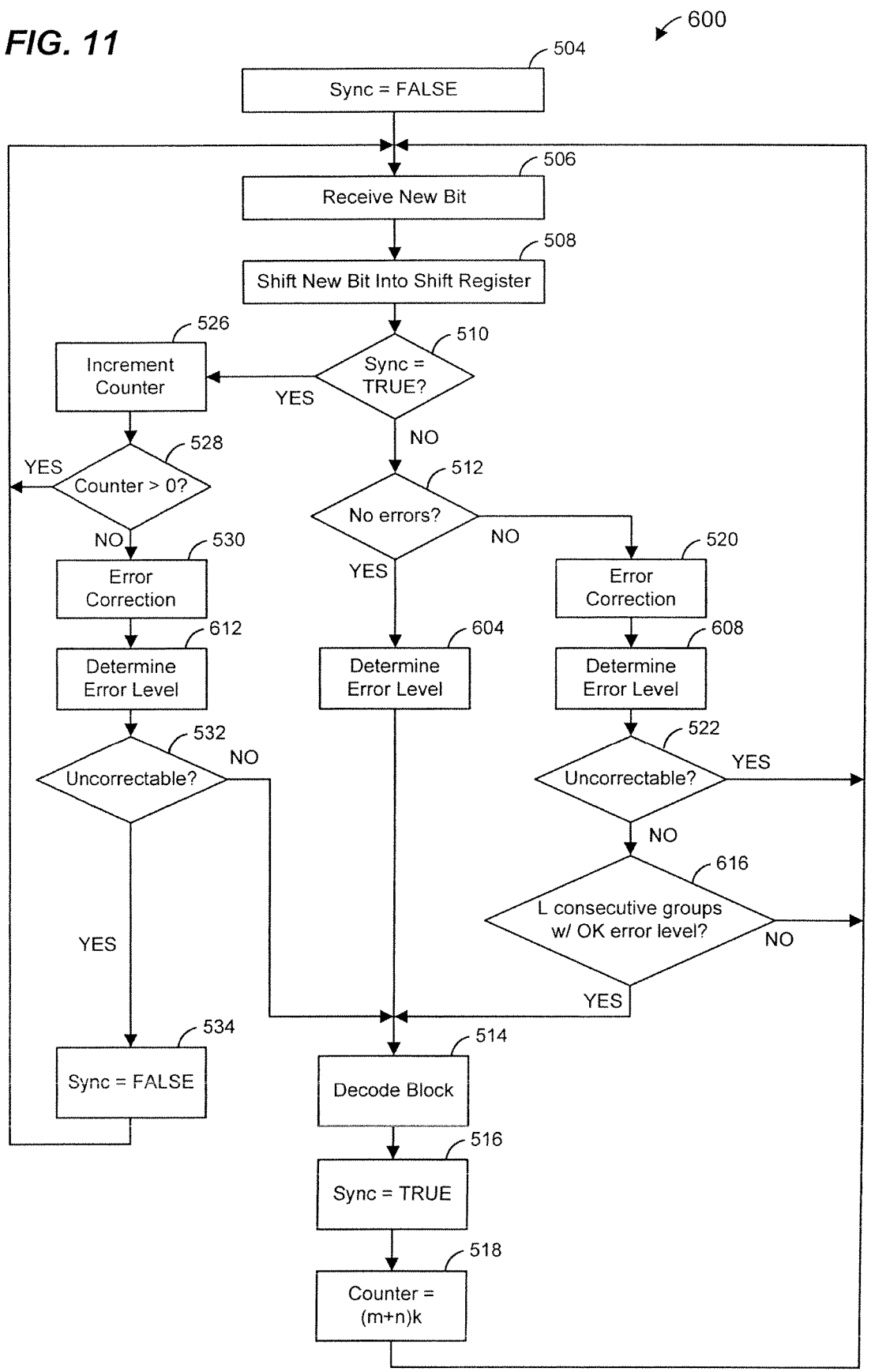
FIG. 11 is a flow diagram of another example method that may be implemented by a receiver having a group detection system such as the group detection system of FIG. 7.

FIG. 11 is a flow diagram of another example method 600 that may be implemented by a receiver having the group detection system such as the group detection system 400 of FIG. 7. Of course, the method 600 may be implemented by receivers having other types of group detection systems as well. For ease of explanation, the method 600 will be described with reference to FIG. 7. The method 600 includes many of the same blocks as FIG. 9. These blocks are like-numbered with those of FIG. 9 and will not be discussed.

Between the blocks 512 and 514, an error level value for the group value in the shift register 404 is calculated at a block 604. The error level value is a quantitative value indicative of a number and/or type of errors in the group. Any of variety of error level values may be calculated. As just one example, the error level value could be calculated by assigning an error level sub-value to each data block in the group, and then adding the sub-values. For instance, a first sub-value could correspond to the data block having no errors, a second sub-value could correspond to the data block having only correctable errors, and a third sub-value could correspond to the data block having uncorrectable errors. As just one specific example provided merely for illustrative purposes, the sub-value corresponding to no errors could be 2, the sub-value corresponding to only correctable errors could be 1, and the sub-value corresponding to uncorrectable errors could be 0. Thus, at the block 604, the error level could be determined as 2*k, because there are no errors in the current group value stored in the shift register 404.

Similarly, between the blocks 520 and 522, an error level value for the group value in the shift register 404 is calculated at a block 608. Also, between the blocks 530 and 532, an error level value is calculated at a block 612.

The blocks 604, 608, and 612 may be implemented by the logic block 470. For example, although not shown in FIG. 7, the outputs of the summation devices 428, 432, 436 could be coupled to inputs of the logic block 470. Similarly, the outputs of the block correctors 448, 452, 456 indicating whether errors are correctable may be provided to the logic block 470. In this implementation, the logic blocks 440 and 460 optionally may be omitted or incorporated into the logic block 470. The logic block 470 could utilize the outputs of the summation devices 428, 432, 436 to determine whether data blocks have any errors, and can utilized the outputs of the block correctors 448, 452, 456 to determine whether data block errors are correctable or uncorrectable.

If at the block 522 it is determined that there are non uncorrectable errors, the flow may proceed to a block 616. At the block 616, it may be determined whether there has been some number L of consecutive groups having an acceptable error level, where L is greater than one. For example, each time the blocks 604, 608, 612 are performed, the determined error level may be stored for future reference in the memory 474. Then, these error levels may be examined at the block 616 to determine whether (m+n)k bits ago, the error level corresponding to that group value was acceptable. Similarly, the stored error levels may be examined to determine whether 2(m+n)k bits ago, the error level corresponding to that group value was acceptable. This may be repeated, if necessary, for group values stored in the shift register 404 up to and including (L−1)(m+n)k bits ago. In other words it may be determined whether for each group value stored i(m+n)k bits ago, for i=1 to L−1, there corresponding error level was acceptable. If all of these L−1 previous group values had acceptable error levels, the flow may proceed to the block 514. If any of the L−1 previous group values had an unacceptable error level, the flow may proceed back to the block 506 to receive the next bit. The block 616 may be implemented by the logic block 470, for example.

Determining whether an error level is acceptable may include comparing the error level to a threshold. The threshold can be set in a variety of ways, and in general will depend on the particular implementation. Further to the illustrative example discussed above, where the sub-value corresponding to no errors is 2, the sub-value corresponding to only correctable errors is 1, and the sub-value corresponding to uncorrectable errors is 0, if k=4, the threshold could be set to four. Thus, if the determined error level is four or greater, this indicates an acceptable error level.

Figure 12:
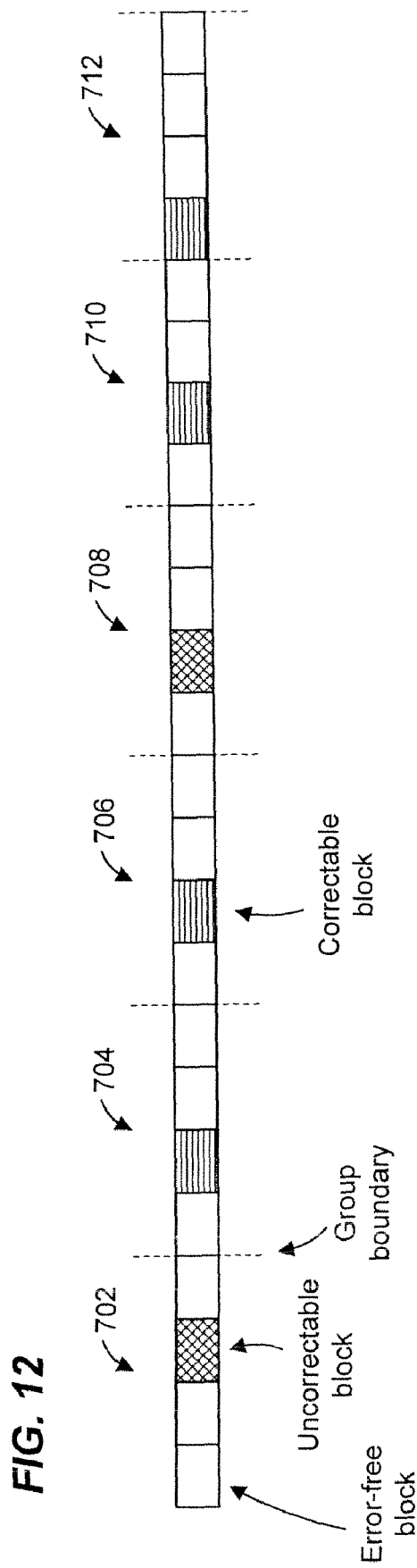
FIG. 12 is a diagram illustrating yet another series of data groups received by a receiver.

FIG. 12 is another diagram illustrating a series of groups 702, 704, 706, 708, 710, and 582, received by a receiver that implements the method 600 of FIG. 11, and also will be used to illustrate the method 600. Each group includes four data blocks (i.e., k=4), and it is assumed that L=2. Also, the error level is calculated by assigning a sub-value of two to each block having no errors, assigning a sub-value of one to each block having correctable errors, and assigning a sub-value of zero to each block having uncorrectable errors. Also, the acceptable level of errors is assumed to be four. Of course, other values of k and L can be used, and other error values and acceptable error levels, and other ways of determining error values may be utilized. These values and/or techniques will vary depending upon the particular implementation. The group 702 includes uncorrectable errors. Thus, the receiver is unsynchronized at least after it receives the group 702. The group 702 includes three blocks with no errors and one block with uncorrectable errors. Thus, the error level for the group 702 is determined to be 6.

When the group 704 is received, the receiver is unsynchronized. The group 704 includes three blocks with no errors and one block with correctable errors. Thus, the error level for the group 704 is determined to be 7. Looking at the group 704 and the preceding group 702, they both have acceptable error levels (e.g., 6 or greater). Thus, because L=2 and two consecutive groups have acceptable error levels of 6 or greater, the group 704 is detected and the receiver is determined to be synchronized.

The next group, group 706, does not include any uncorrectable errors. Thus, the group 706 is detected and the receiver remains synchronized. Also, an error level of 7 is determined for the group 706.

The next group, group 708, includes uncorrectable errors. Thus, the group 708 is not detected and the receiver becomes unsynchronized. The error level for the group 708 is determined to be 6.

The next group, group 710 does not include any uncorrectable errors, and its error level is determined to be 7. Looking at the group 710 and the preceding group 708, they both have acceptable error levels (e.g., 6 or greater). Thus, because L=2 and two consecutive groups have acceptable error levels of 6 or greater, the group 710 is detected and the receiver is determined to be synchronized.

One of ordinary skill in the art will recognize many variations of the above-described methods and apparatus. Referring to FIG. 7, for example, one or both of the logic block 440 and the logic block 460 could be omitted and/or incorporated into the logic block 470. For example, the logic block 470 could generate the GROUP DETECTED signal directly based on the outputs of the summation devices 428, 432, 436 and the block correctors 448, 452, 456, rather than based on the outputs of the logic blocks 440 and 460. As another example, the portion 408 could be omitted and its functionality could be incorporated into the portion 412. For instance, the block correctors 448, 452, 456 could be configured to generate outputs that indicate whether the data blocks include errors, and if so, whether the errors are uncorrectable. As yet another example, a single block corrector could be utilized, rather than k block correctors 448, 452, 456, by time-sharing the block corrector among the k data blocks. In a similar manner, a single summation device could be utilized, rather than k summation devices 428, 432, 436.

As still another example, at the block 524 of FIG. 8, rather than determining if there were L consecutive correctable groups, it may be determined if there are L correctable groups out of set of P consecutive groups. Similarly, at the block 616 of FIG. 11, rather than determining if there were L consecutive groups with an acceptable error level, it may be determined if there are L groups out of set of P consecutive groups having an acceptable error level. As yet another example, instead of determining if each of L groups has an acceptable error level, it may be determined if an aggregate error level of the L groups is an acceptable range. As still another example, additional memory may be utilized to store at least some of the previous P consecutive groups. Then, when a group is detected, the previous groups stored in the memory may be decoded.

Although the examples described above involved receiving bits, similar group detectors could operate with other types of symbols. For example, each received symbol could correspond to multiple bits, and the error detectors and the block correctors could operate on symbols rather than bits. One of ordinary skill in the art will recognize many other variations.

A group detector apparatus and/or method such as described above may be utilized in a variety of devices that require the detection of a block encoded group of data blocks. As just one example, such a group detector apparatus and/or method may be useful for detecting a group encoded signal from a transmitter. As another example such as group detector apparatus and/or method may be useful for detecting group encoded data stored on a computer readable media, such as a random access memory device, a read-only memory device, a magnetic disk, or an optical disk. More generally, such a group detector may be utilized in a variety of electronic devices such as communication devices, computation devices, storage devices, networking devices, measurement devices, etc. Referring now to FIGS. 13A-13H, a few specific examples of devices that may utilize a group detector apparatus and/or method such as described above will be described.

Figure 13A:
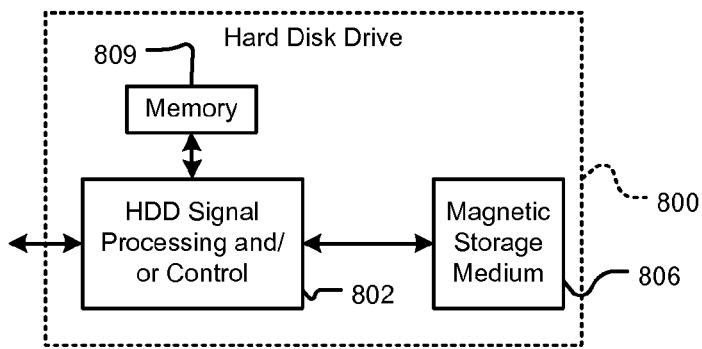
FIG. 13A is a block diagram of a hard disk drive system that may utilize a group detection system such as the group detection system of FIG. 7.

For example, referring to FIG. 13A, a hard disk drive 800 may include a group detector, which may be implemented by signal processing and/or control circuits, which are generally identified in FIG. 13A at 802. In some implementations, signal processing and/or control circuit 802 and/or other circuits (not shown) in HDD 800 may process data, perform coding and/or encryption, perform calculations, and/or format data that is output to and/or received from a magnetic storage medium 806.

HDD 800 may communicate with a host device (not shown) such as a computer, mobile computing devices such as personal digital assistants, cellular phones, media or MP3 players and the like, and/or other devices via one or more wired or wireless communication links 808. HDD 800 may be connected to memory 809, such as random access memory (RAM), a low latency nonvolatile memory such as flash memory, read only memory (ROM) and/or other suitable electronic data storage.

Figure 13B:
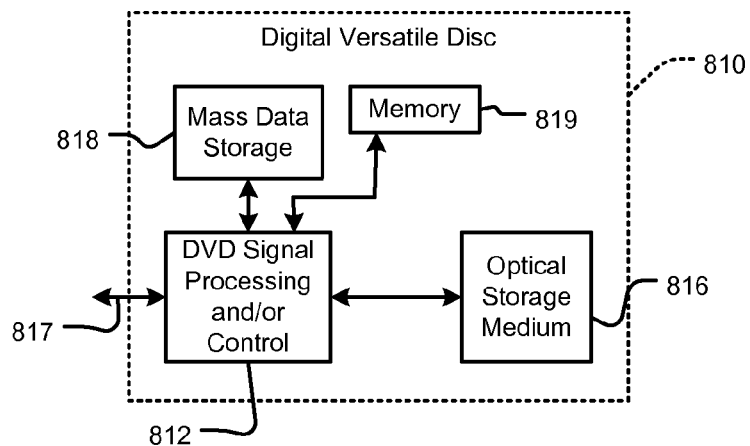
FIG. 13B is a block diagram of a digital versatile drive system that may utilize a group detection system such as the group detection system of FIG. 7.

Referring now to FIG. 13B, a group detector may be utilized in a digital versatile disc (DVD) drive 810. The group detector may be implemented by either or both signal processing and/or control circuits, which are generally identified in FIG. 13B at 812, and/or mass data storage 818 of DVD drive 810. Signal processing and/or control circuit 812 and/or other circuits (not shown) in DVD 810 may process data, perform coding and/or encryption, perform calculations, and/or format data that is read from and/or data written to an optical storage medium 816. In some implementations, signal processing and/or control circuit 812 and/or other circuits (not shown) in DVD 810 can also perform other functions such as encoding and/or decoding and/or any other signal processing functions associated with a DVD drive.

DVD drive 810 may communicate with an output device (not shown) such as a computer, television or other device via one or more wired or wireless communication links 817. DVD 810 may communicate with mass data storage 818 that stores data in a nonvolatile manner. Mass data storage 818 may include a hard disk drive (HDD) such as that shown in FIG. 13B. The HDD may be a mini HDD that includes one or more platters having a diameter that is smaller than approximately 1.8". DVD 810 may be connected to memory 819, such as RAM, ROM, low latency nonvolatile memory such as flash memory, and/or other suitable electronic data storage.

Figure 13C:
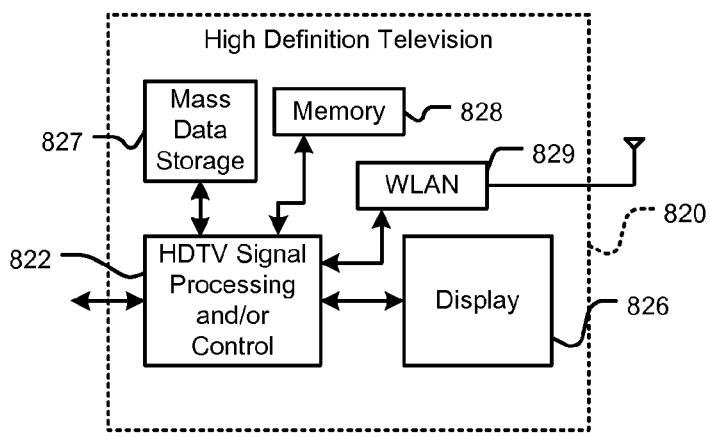
FIG. 13C is a block diagram of a high definition television that may utilize a group detection system such as the group detection system of FIG. 7.

Referring to FIG. 13C, a group detector may be utilized in a high definition television (HDTV) 820. The HDTV 820 includes signal processing and/or control circuits, which are generally identified in FIG. 13C at 822, a WLAN interface 829, and a mass data storage 827. The group detector may be utilized in the WLAN interface 829 or the signal processing circuit and/or control circuit 822, for example. HDTV 820 receives HDTV input signals in either a wired or wireless format and generates HDTV output signals for a display 826. In some implementations, signal processing circuit and/or control circuit 822 and/or other circuits (not shown) of HDTV 820 may process data, perform coding and/or encryption, perform calculations, format data and/or perform any other type of HDTV processing that may be required.

HDTV 820 may communicate with mass data storage 827 that stores data in a nonvolatile manner such as optical and/or magnetic storage devices. The mass data storage 827 may include one or more hard disk drives (HDDs) and/or one or more digital versatile disks (DVDs). At least one HDD may have the configuration shown in FIG. 13A and/or at least one DVD may have the configuration shown in FIG. 13B. One or more of the HDDs may be a mini HDD that includes one or more platters having a diameter that is smaller than approximately 1.8". HDTV 820 may be connected to memory 828 such as RAM, ROM, low latency nonvolatile memory such as flash memory and/or other suitable electronic data storage. HDTV 820 also may support connections with a WLAN via a WLAN network interface 829.

Figure 13D:
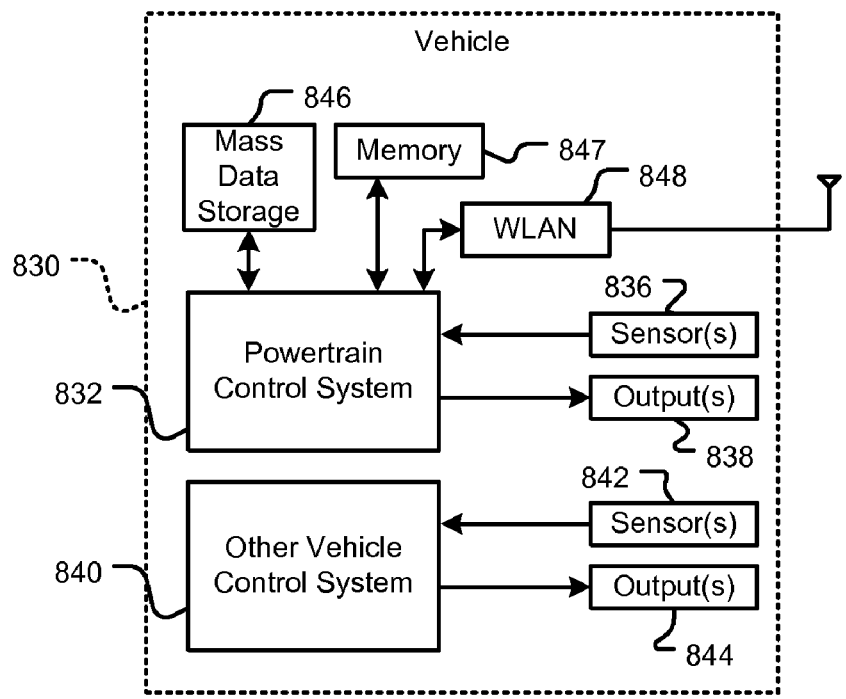
FIG. 13D is a block diagram of a vehicle that may utilize a group detection system such as the group detection system of FIG. 7.

Referring now to FIG. 13D, a group detector may be utilized in a control system of a vehicle 830. In some implementations, the group detector may be implemented by a power train control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The group detector may also be implemented in other control systems 840 of vehicle 830. Control system 840 may likewise receive signals from input sensors 842 and/or output control signals to one or more output devices 844. In some implementations, control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 832 may communicate with mass data storage 846 that stores data in a nonvolatile manner. Mass data storage 846 may include optical and/or magnetic storage devices for example hard disk drives HDD and/or DVDs. At least one HDD may have the configuration shown in FIG. 13A and/or at least one DVD may have the configuration shown in FIG. 13B. One or more of the HDDs may be a mini HDD that includes one or more platters having a diameter that is smaller than approximately 1.8". Powertrain control system 832 may be connected to memory 847 such as RAM, ROM, low latency nonvolatile memory such as flash memory and/or other suitable electronic data storage. Powertrain control system 832 also may support connections with a WLAN via a WLAN network interface 848. The group detector may also be implemented in the WLAN interface 848. The control system 840 may also include mass data storage, memory and/or a WLAN interface (all not shown).

Figure 13E:
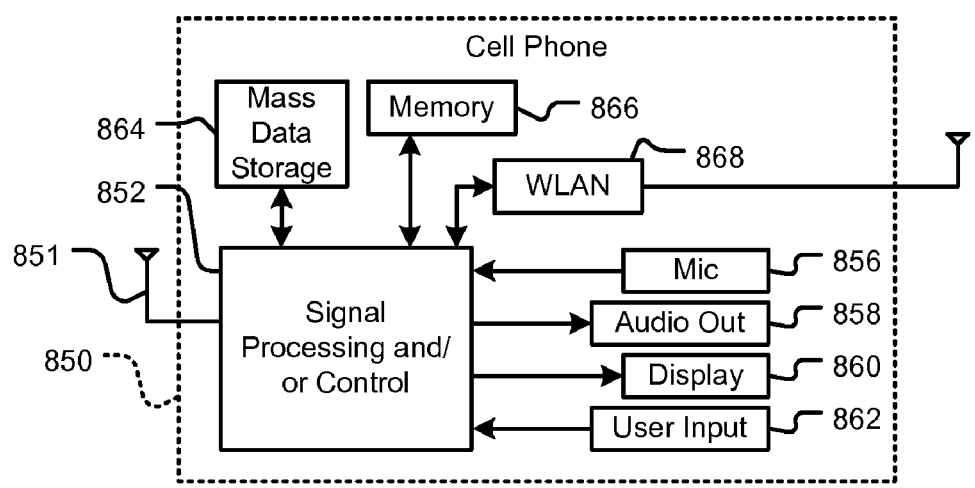
FIG. 13E is a block diagram of a cellular phone that may utilize a group detection system such as the group detection system of FIG. 7.

Referring now to FIG. 13E, a group detector may be utilized in a cellular phone 850 that may include a cellular antenna 851. The cellular phone 850 includes signal processing and/or control circuits, which are generally identified in FIG. 13E at 852, a WLAN interface 868, and a mass data storage 864. The group detector may be implemented in the signal processing and/or control circuits 852 and/or the WLAN interface 868, for example. In some implementations, cellular phone 850 includes a microphone 856, an audio output 858 such as a speaker and/or audio output jack, a display 860 and/or an input device 862 such as a keypad, pointing device, voice actuation and/or other input device. Signal processing and/or control circuits 852 and/or other circuits (not shown) in cellular phone 850 may process data, perform coding and/or encryption, perform calculations, format data and/or perform other cellular phone functions.

Cellular phone 850 may communicate with mass data storage 864 that stores data in a nonvolatile manner such as optical and/or magnetic storage devices for example hard disk drives HDD and/or DVDs. At least one HDD may have the configuration shown in FIG. 13A and/or at least one DVD may have the configuration shown in FIG. 13B. At least one HDD may be a mini HDD that includes one or more platters having a diameter that is smaller than approximately 1.8". Cellular phone 850 may be connected to memory 866 such as RAM, ROM, low latency nonvolatile memory such as flash memory and/or other suitable electronic data storage. Cellular phone 850 also may support connections with a WLAN via a WLAN network interface 868.

Figure 13F:
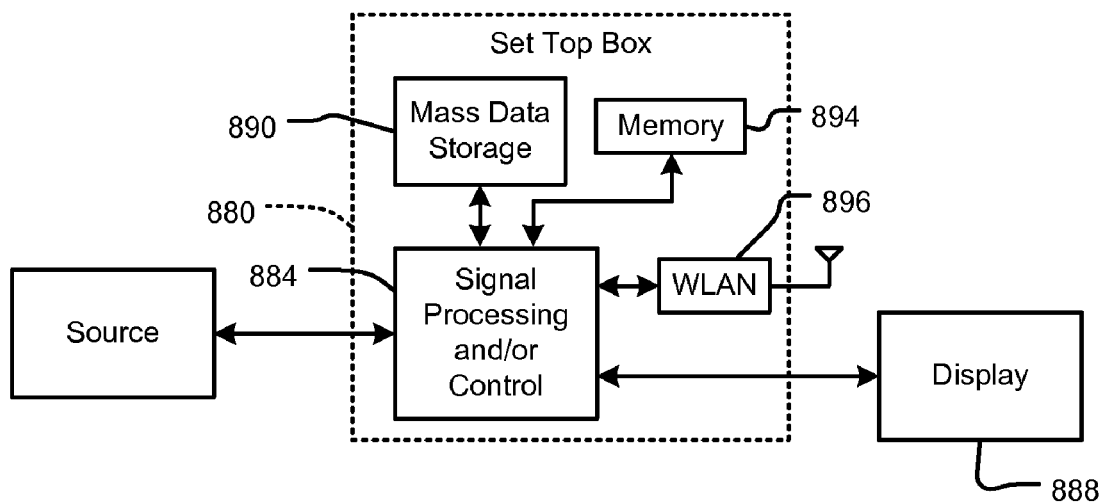
FIG. 13F is a block diagram of a set top box that may utilize a group detection system such as the group detection system of FIG. 7.

Referring now to FIG. 13F, a group detector may be utilized in a set top box 880. The set top box 880 includes signal processing and/or control circuits, which are generally identified in FIG. 13F at 884, a WLAN interface 896, and a mass data storage device 890. The group detector may be implemented in the signal processing and/or control circuits 884 and/or the WLAN interface 896, for example. Set top box 880 receives signals from a source such as a broadband source and/or outputs standard and/or high definition audio/video signals suitable for a display 888 such as a television and/or monitor and/or other video and/or audio output devices. Signal processing and/or control circuits 884 and/or other circuits (not shown) of the set top box 880 may process data, perform coding and/or encryption, perform calculations, format data and/or perform any other set top box function.

Set top box 880 may communicate with mass data storage 890 that stores data in a nonvolatile manner. Mass data storage 890 may include optical and/or magnetic storage devices for example hard disk drives HDD and/or DVDs. At least one HDD may have the configuration shown in FIG. 13A and/or at least one DVD may have the configuration shown in FIG. 13B. At least one HDD may be a mini HDD that includes one or more platters having a diameter that is smaller than approximately 1.8". Set top box 880 may be connected to memory 894 such as RAM, ROM, low latency nonvolatile memory such as flash memory and/or other suitable electronic data storage. Set top box 880 also may support connections with a WLAN via a WLAN network interface 896.

Figure 13G:
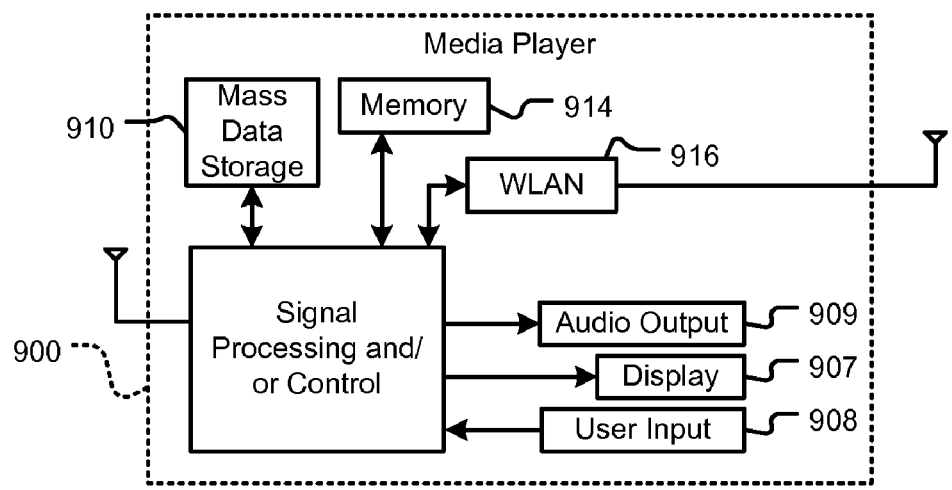
FIG. 13G is a block diagram of a media player that may utilize a group detection system such as the group detection system of FIG. 7.

Referring now to FIG. 13G, a group detector may be utilized in a media player 900. The media player 900 may include signal processing and/or control circuits, which are generally identified in FIG. 13G at 904, a WLAN interface 916, and a mass data storage device 910. The group detector may be implemented in the signal processing and/or control circuits 904 and/or the WLAN interface 916, for example. In some implementations, media player 900 includes a display 907 and/or a user input 908 such as a keypad, touchpad and the like. In some implementations, media player 900 may employ a graphical user interface (GUI) that typically employs menus, drop down menus, icons and/or a point-and-click interface via display 907 and/or user input 908. Media player 900 further includes an audio output 909 such as a speaker and/or audio output jack. Signal processing and/or control circuits 904 and/or other circuits (not shown) of media player 900 may process data, perform in coding and/or encryption, perform calculations, format data and/or perform any other media player function.

Media player 900 may communicate with mass data storage 910 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 13A and/or at least one DVD may have the configuration shown in FIG. 13B. At least one HDD may be a mini HDD that includes one or more platters having a diameter that is smaller than approximately 1.8". Media player 900 may be connected to memory 914 such as RAM, ROM, low latency nonvolatile memory such as flash memory and/or other suitable electronic data storage. Media player 900 also may support connections with a WLAN via a WLAN network interface 916. Still other implementations in addition to those described above are contemplated.

Figure 13H:
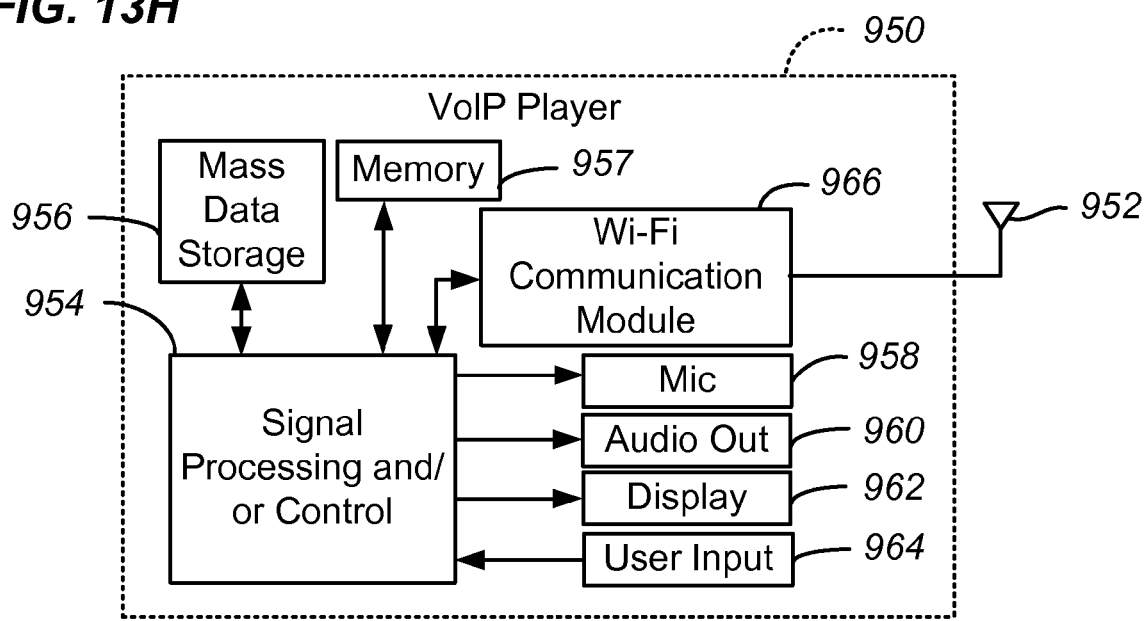
FIG. 13H is a block diagram of a voice over IP device that may utilize a group detection system such as the group detection system of FIG. 7.

Referring to FIG. 13H, a group detector may be utilized in a Voice over Internet Protocol (VoIP) phone 950 that may include an antenna 954, signal processing and/or control circuits 958, a wireless interface 962, and a mass data storage 966. The group detector may be implemented in the signal processing and/or control circuits 958 and/or the wireless interface 962, for example. In some implementations, VoIP phone 950 includes, in part, a microphone 970, an audio output 974 such as a speaker and/or audio output jack, a display monitor 978, an input device 982 such as a keypad, pointing device, voice actuation and/or other input devices, and a Wireless Fidelity (Wi-Fi) communication module 962. Signal processing and/or control circuits 958 and/or other circuits (not shown) in VoIP phone 950 may process data, perform coding and/or encryption, perform calculations, format data and/or perforin other VoIP phone functions.

VoIP phone 950 may communicate with mass data storage 966 that stores data in a nonvolatile manner such as optical and/or magnetic storage devices, for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". VoIP phone 950 may be connected to memory 986, which may be a RAM, ROM, low latency nonvolatile memory such as flash memory and/or other suitable electronic data storage. VoIP phone 950 is configured to establish communications link with a VoIP network (not shown) via Wi-Fi communication module 962.

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A method for synchronizing to a signal encoded as a group of blocks, comprising:
    receiving a data symbol;
    storing the received data symbol with previously received data symbols as a current potential group;
    detecting errors, if any, in the current potential group;
    determining a level of errors associated with the current potential group;
    determining the current potential group is an actual group if the current potential group is without errors; and
    determining the current potential group is an actual group if a set of L potential groups including the current potential group and at least one previous potential group has an acceptable level of errors;
    wherein the set of L potential groups is from a set of P consecutive potential groups;
    wherein P is an integer greater than one and L is an integer less than or equal to P.

2. A method according to claim 1, wherein L equals P;
    wherein determining the current potential group is an actual group if the set of L potential groups has the acceptable level of errors comprises deter mining if each potential group in the set of P consecutive potential groups has the acceptable level of errors.

3. A method according to claim 2, wherein determining the level of errors comprises determining a quantitative value associated with the current potential group based on the detected errors, if any;
    wherein determining if each potential group in the set of P consecutive potential groups has the acceptable level of errors comprises determining if each corresponding quantitative value associated with each potential group in the set of P consecutive potential groups is within an acceptable range.

4. A method according to claim 3, wherein determining the quantitative value associated with the current potential group comprises:
    determining a sub-value associated with each data block in the current potential group; and
    determining the quantitative value based on the sub-values.

5. A method according to claim 2, wherein determining the level of errors comprises deter mining if the current potential group includes uncorrectable errors;
    wherein determining if each potential group in the set of P consecutive potential groups has the acceptable level of errors comprises determining if any potential group in the set of P consecutive potential groups includes one or more uncorrectable errors.

6. A method according to claim 1, wherein L is less than P;
    wherein determining the current potential group is an actual group if the set of L potential groups has the acceptable level of errors comprises determining if a minimum number of potential groups in the set of P consecutive potential groups have the acceptable level of errors.

7. A method according to claim 6, wherein determining the level of errors comprises determining a quantitative value associated with the current potential group based on the detected errors, if any;
    wherein determining if the minimum number of potential groups in the set of P consecutive potential groups has the acceptable level of errors comprises determining if at least the minimum number of potential groups have associated quantitative values within an acceptable range.

8. A method according to claim 7, wherein determining the quantitative value associated with the current potential group comprises:
    determining a sub-value associated with each data block in the current potential group; and
    determining the quantitative value based on the sub-values.

9. A method according to claim 6, wherein determining the level of errors comprises determining if the current potential group includes uncorrectable errors;
    wherein determining if the minimum number of potential groups in the set of P consecutive potential groups has the acceptable level of errors comprises deter wining if at least the minimum number of potential groups lack one or more uncorrectable errors.

10. A method according to claim 1, wherein determining the current potential group is an actual group if the set of L potential groups has the acceptable level of errors comprises determining if the set of L potential groups has an acceptable aggregate level of errors.

11. A method according to claim 1, further comprising generating a signal indicating a detection of a group if it is determined that the potential group is an actual group.

12. A method according to claim 1, wherein the received data symbol is a bit.

13. A method according to claim 1, wherein the received data symbol corresponds to multiple bits.

14. A method of decoding data that is encoded as a group of blocks, comprising:
   wherein if a group boundary is not known, the method comprises:
      receiving a data symbol;
      storing the received data symbol with previously received data symbols as a current potential group;
      detecting errors, if any, in the current potential group;
      determining a level of errors associated with the current potential group;
      determining the current potential group is an actual group if the current potential group is without errors; and
      determining the current potential group is an actual group if a set of L potential groups including the potential group and at least one previous potential group has an acceptable level of errors;
      wherein the set of L potential groups is from a set of P consecutive potential groups;
      wherein P is an integer greater than one and L is an integer less than or equal to P;
      correcting errors, if any, in the actual group if it is determined that the current potential group is the actual group, and
      decoding the actual group if it is determined that the current potential group is the actual group;
   wherein if the group boundary is known, the method comprises:
      receiving a plurality of data symbols corresponding to a next group;
      storing the plurality of received data symbols as the next group;
      detecting errors, if any, in the next group;
      indicating that group boundaries are unknown if an uncorrectable error is detected;
      correcting errors in the next group if no uncorrectable errors are detected; and
      decoding the next group if no uncorrectable errors are detected.

15. A method according to claim 14, further comprising, if the group boundary is known, determining a level of errors associated with the next group.

16. A method according to claim 14, wherein L equals P;
   wherein determining the current potential group is an actual group if the set of L potential groups has the acceptable level of errors comprises determining if each potential group in the set of P consecutive potential groups have the acceptable level of errors.

17. A method according to claim 16, wherein determining the level of errors comprises determining a quantitative value associated with the current potential group based on the detected errors, if any;
   wherein determining if each potential group in the set of P consecutive potential groups has the acceptable level of errors comprises determining if the each corresponding quantitative value associated with each potential group in the set of P consecutive potential groups is within an acceptable range.

18. A method according to claim 17, wherein determining the quantitative value associated with the current potential group comprises:
   determining a sub-value associated with each data block in the current potential group; and
   determining the quantitative value based on the sub-values.

19. A method according to claim 16, wherein determining the level of errors comprises determining if the current potential group includes uncorrectable errors;
   wherein determining if each potential group in the set of P consecutive potential groups has the acceptable level of errors comprises determining if any potential group in the set of P consecutive potential groups includes one or more uncorrectable errors.

20. A method according to claim 14, wherein L is less than P;
   wherein determining the current potential group is an actual group if the set of L potential groups has the acceptable level of errors comprises determining if a minimum number of potential groups in the set of P consecutive potential groups has the acceptable level of errors.

21. A method according to claim 20, wherein determining the level of errors comprises determining a quantitative value associated with the current potential group based on the detected errors, if any;
   wherein determining if the minimum number of potential groups in the set of P consecutive potential groups has the acceptable level of errors comprises determining if at least the minimum number of potential groups have associated quantitative values within an acceptable range.

22. A method according to claim 21, wherein determining the quantitative value associated with the current potential group comprises:
   determining a sub-value associated with each data block in the current potential group; and
   determining the quantitative value based on the sub-values.

23. A method according to claim 20, wherein determining the level of errors comprises determining if the current potential group includes uncorrectable errors;
   wherein determining if the minimum number of potential groups in the set of P consecutive potential groups has the acceptable level of errors comprises determining if at least the minimum number of potential groups lack one or more uncorrectable errors.

24. A method according to claim 14, wherein determining the current potential group is an actual group if the set of L potential groups has the acceptable level of errors comprises determining if the set of L potential groups has an acceptable aggregate level of errors.

25. A method according to claim 14, wherein the received data symbol is a bit.

26. A method according to claim 14, wherein the received data symbol corresponds to multiple bits.

27. A group detection device to detect data encoded as a group of blocks, comprising:
   a shift register;
   an error detector coupled to the shift register, the error detector configured to detect errors in each block of a plurality of blocks of a current potential group stored in the shift register, the error detector including an output to indicate whether each block is error free;

a block corrector coupled to the shift register, the block corrector configured to correct errors, when possible, in each block of the plurality of blocks of the current potential group stored in the shift register, the block corrector including an output to indicate whether each block includes one or more uncorrectable errors;

a memory;

a logic block coupled to the output of the error detector and the output of the block corrector, and coupled to the memory, the logic block configured to:

determine a level of errors associated with the current potential group based on at least one of the output of the error detector and the output of the block corrector, store the determined level of errors in the memory, generate an indicator that the current potential group is an actual group if the current potential group is without errors, and generate an indicator that the current potential group is an actual group if a set of L potential groups including the current potential group and at least one previous potential group has an acceptable level of errors;

wherein the set of L potential groups is from a set of P consecutive potential groups;

wherein P is an integer greater than one and L is an integer less than or equal to P.

28. A group detection device according to claim 27, wherein the error detector comprises a plurality of individual error detectors, each individual error detector configured to detect errors in a corresponding block of the plurality of blocks of the current potential group, each individual error detector including a corresponding output to indicate whether the corresponding block is error free.

29. A group detection device according to claim 28, wherein the block corrector comprises a plurality of individual block correctors, each individual block corrector configured to correct errors, when possible, in a corresponding block of the plurality of blocks of the current potential group, each individual block corrector including a corresponding output to indicate whether the corresponding block includes one or more uncorrectable errors.

30. A group detection device according to claim 29, wherein the error detector and the block corrector are integrated within a single device, wherein each individual block corrector is configured to detect errors in the corresponding block of the plurality of blocks of the current potential group, wherein each individual error detector includes the corresponding output to indicate whether the corresponding block is error free.

* * * * *